United States Patent [19]

Likes

[11] 4,307,343
[45] Dec. 22, 1981

[54] MOVING GRADIENT ZEUGMATOGRAPHY

[75] Inventor: Richard S. Likes, Schenectady, N.Y.

[73] Assignee: General Electric Company, Schenectady, N.Y.

[21] Appl. No.: 67,697

[22] Filed: Aug. 20, 1979

[51] Int. Cl.³ .............................................. G01N 27/00
[52] U.S. Cl. ..................................... 324/307; 324/309
[58] Field of Search .......................................... 324/309

[56] References Cited

U.S. PATENT DOCUMENTS

| | | | |
|---|---|---|---|
| 4,015,196 | 3/1977 | Moore et al. | 324/309 |
| 4,021,726 | 5/1977 | Garroway | 324/309 |
| 4,045,723 | 8/1977 | Ernst | 324/309 |
| 4,070,611 | 1/1978 | Ernst | 324/309 |
| 4,115,730 | 9/1978 | Mansfield | 324/309 |
| 4,165,479 | 8/1979 | Mansfield | 324/0.5 R |

FOREIGN PATENT DOCUMENTS 2921252 12/1979 Fed. Rep. of Germany .

Primary Examiner—Michael J. Tokar
Attorney, Agent, or Firm—Alexander M. Gerasimow; James C. Davis; Marvin Snyder

[57] ABSTRACT

Nuclear magnetic resonance phenomena are employed to generate a two dimensional image of a thin planar slice through a body under investigation. The apparatus herein operates to determine the spin density distribution in a planar slab within the body which typically comprises a biological organism. Each pixel in the resulting image is distinguished by applying time-varying magnetic field gradients so that the frequency history of the spins in each pixel is uniquely distinguishable. Additionally, novel radio frequency excitation means assure selective excitation within the planar slab.

13 Claims, 9 Drawing Figures

MOVING GRADIENT ZEUGMATOGRAPHY

BACKGROUND OF THE INVENTION

This invention relates to a nuclear magnetic resonance apparatus for use in producing two-dimensional images of internal body structures and more particularly it relates to nuclear magnetic resonance apparatus in which two-dimensional spin density distribution is selectively encoded into a rapidly observable time signal whereby the necessary data for image reconstruction is immediately available.

Nuclear magnetic resonance is a phenomenon first observed by physicists. When the positively charged and spinning atomic nucleus is placed in a uniform magnetic field, there is a precession of the spin axis of the nucleus. The angular frequency of precession $\omega$ depends on the magnetic field strength H and a constant $\gamma$ which is called the gyromagnetic ratio. The relation between these quantities is given by:

$$\omega = \gamma H. \tag{1}$$

Once the nucleus is set to precessing in such a magnetic field, it is thereafter capable of absorbing electromagnetic radiation at the angular precession frequency. Following absorption of electromagnetic energy, the nucleus reradiates some of the energy which may be subsequently detected and observed. The water molecule is one that is particularly amenable to study by such nuclear magnetic resonance methods. This amenability to study is largely thought to arise from the unpaired hydrogen protons in the water molecule. Because biological cells and tissues comprise water as a major constituent, nuclear magnetic resonance methods are particularly applicable to such specimens. In particular by determining the nuclear spin population density in various portions of a biological specimen, it is possible to generate an image representative of internal body structures. Because carcinomic cell structures exhibit a peculiar affinity for water, these structures are well suited for detection by nuclear magnetic resonance imaging methods.

A typical value for the above-mentioned gyromagnetic ratio $\gamma$ is approximately 4.26 KHz/gauss. For a magnetic field strength H of approximately 1.2 kilogauss, equation (1) above implies that a radio frequency electromagnetic field of approximately 5.1 MHz is appropriate for nuclear spin excitation. Following this excitation two separate relaxation times occur during which the sample reradiates. The spin-lattice relaxation time, $T_1$, is approximately 0.5 sec for human tissue; the spin-spin relaxation time, $T_2$, is approximately 0.05 sec for human tissue.

Nuclear magnetic resonance imaging as a medical diagnostic method offers significant advantages, the most significant of which being the total noninvasive nature of the procedure. No ionizing radiation is employed as is done in present computerized tomographic imaging systems. However, in spite of apparent efforts to solve the problem, investigators in this field have long been plagued with the problem of exposure time length required to insure that image resolution is adequate. A general requirement for two-dimensional zeugmatographic image reconstruction is that the signal representing the radiation from a particular pixel (picture element) be essentially independent of the signal generated by all nuclear spins except the ones in the physical location corresponding to the pixel position. In some of the nuclear magnetic resonance imaging methods proposed, this pixel identification has been accomplished by operating on one pixel at a time (or one or more lines at a time) and discarding the signals from the remainder of the image. For example, such methods are described in "Image Formation by Nuclear Magnetic Resonance: The Sensitive-Point Method" by W. Hinshaw in Vol. 47, No. 8, pp. 3709–3721 of the *Journal of Applied Physics* (1975) and also in "Biological and Medical Imaging by NMR" by P. Mansfield and I. L. Pykett in Vol. 29, pp. 355–373 of the *Journal of Magnetic Resonance* (1978). Others achieved this pixel identification by coherently adding the signals from many separate Fourier Transforms of the object. Such methods are described in "NMR Fourier Zeugmatography" by Kumar, Webti, and Ernst in Vol. 18, pp. 69–83 of the *Journal of Magnetic Resonance* (1975) and in "Sensitivity and Performance Time in NMR Imaging" by P. Bruner and R. R. Ernst in Vol. 33, pp. 83–106 of the *Journal of Magnetic Resonance* (1979). Finally, in another method of pixel identification, the images are reconstructed by coherently adding the signal generated in many one-dimensional projections. Such a method is described in "Image Formation by Induced Local Interactions: Examples Employing Nuclear Magnetic Resonance" by P. C. Lauterbur in *Nature*, Vol. 242, No. 5394, pp. 190–191 (1973). However, while these methods generally accomplish the desired objective, they result in poor signal-to-noise ratio for the reconstructed image unless the data is obtained from a very large number of free induction delays. However, such approaches require a length of time to acquire such data for exceeding the length of time that a patient can be expected to remain immobilized. An alternative approach to this problem is to apply time-varying magnetic field gradients, such that the frequency history of the spins in each pixel is distinguishably different from that of every other pixel. This latter approach taken in the present invention is more particularly described below.

SUMMARY OF THE INVENTION

In accordance with a preferred embodiment of the present invention, an apparatus for determining nuclear magnetic resonance spin density distributions comprises means for selectively exciting a slab of an object under examination, means for applying to said object a spatial differentiation magnetic field, means for receiving radiated electromagnetic energy from said body, and means for operating on an electrical signal produced by said radiation to generate therefrom other signals representative of the spin density distribution in the slab. For ease of presenting descriptions of the apparatus herein, a coordinate frame of reference having mutually perpendicular x, y and z axes are used, said x and y coordinate axes being within the slab of interest and said z direction axis being perpendicular to said slab. Throughout the data collection period, a constant magnetic field having an intensity $H_0$ is applied to the body. In accordance with a preferred embodiment of the present invention, the excitation means further acts to apply a time-dependent magnetic field gradient along the z axis, during which a radio frequency pulse is applied. The z field gradient is then removed to permit free precession.

In accordance with another embodiment of the present invention following the above-described excitation for producing free nuclear precession, spatial differentiation means are engaged for applying to said object a magnetic field having the form $H_0+G_1(t)x+G_2(t)y$. It is the application of this spatial differentiation magnetic field which permits encoding two-dimensional spin density distribution information into a single time dependent electrical signal. These electrical signals are typically received from the excited nuclei by means of a coil disposed about the sample body. These signals are then operated upon by computational means in accordance with several algorithms particularly suited to the present spatial differentiation scheme to produce signals representative of the spin density distribution in the slab.

DETAILED DESCRIPTION OF THE INVENTION

Before a description of the actual apparatus preferably employed in practicing the present invention is described, it is instructive to consider the various stages of the imaging process. In the apparatus of the present invention, there are three such stages: excitation, spatial differentiation, and reconstruction.

Figure 6:
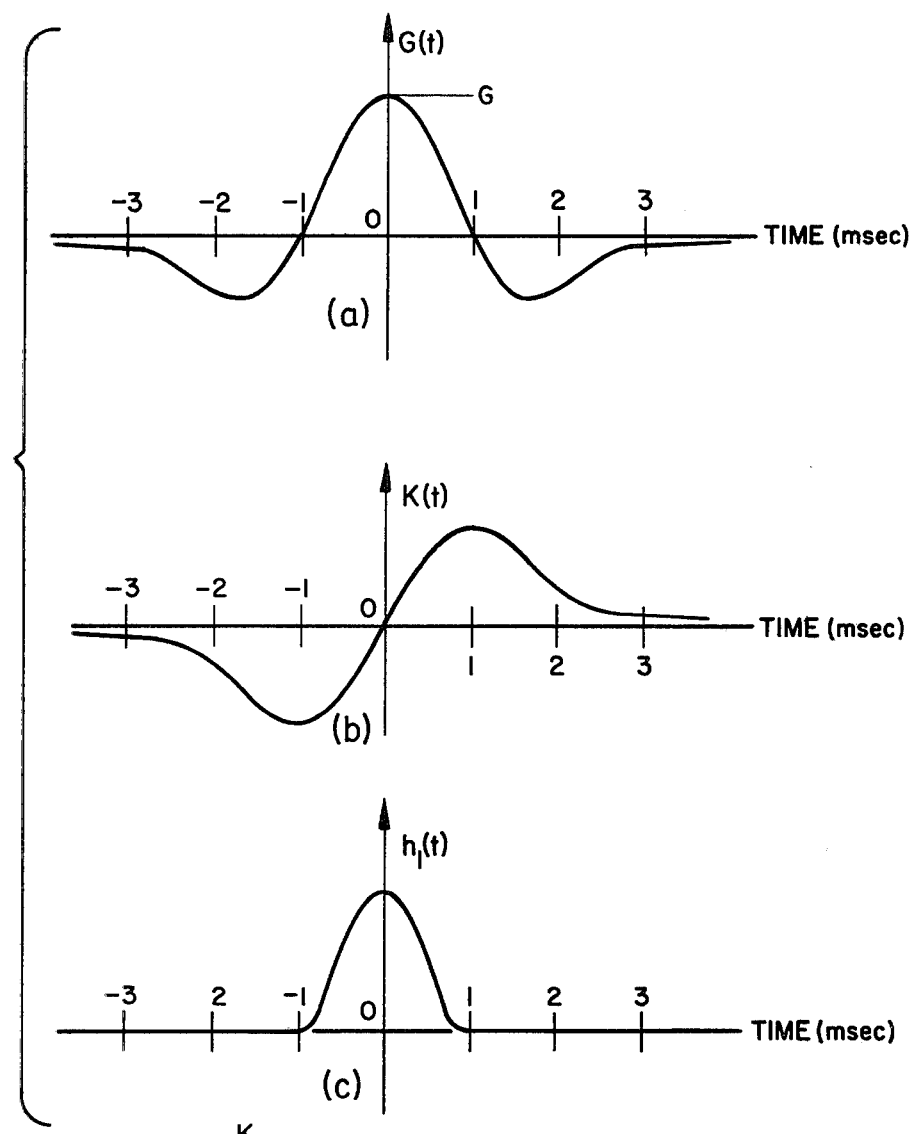
FIG. 6 illustrates several curves which are related to the magnetic excitation signal.

In the excitation stage, a constant magnetic field $H_0$ is applied to the sample under consideration. Additionally, there is also applied to the sample a time varying magnetic field varying linearly in the z direction. The time variation of the field is characterized by the function $G(t)$, a preferable form of which is shown in FIG. 6a, and is more particularly described below. Function $G(t)$ contains substantially audio frequency components. For the purpose of illustration, the most salient feature of the applied magnetic field is its linear variation in the z direction. Because of this linear variation, the precession frequencies predicted by equation (1) likewise vary linearly in the z direction throughout the sample body. Also, the resonant frequencies of electromagnetic radiation absorption vary linearly in the z direction. Thus, by applying a radio frequency electromagnetic field to the sample body at a selected frequency, only those nuclear spins in a selected slab $\Delta z$ thick are excited. The temporal variation of the excitation magnetic field is chosen in a manner to be described below, so as to optionally select the spins in a thin slab for excitation and subsequent reradiation. Thus, the magnetic field during the excitation stage is described as:

$$H(z,t) = H_0 + zG(t). \tag{2}$$

The second stage of image generation is referred to as spatial differentiation. Once having excited a thin slab of spins within the body under investigation by applying a magnetic field such as that given in equation (2) and by concurrently applying a radio frequency radiative source to excite said nuclear spins, the excitation is removed and spin relaxation occurs. During spin relaxation, previously absorbed magnetic radiation is reradiated and typically received by a coil surrounding the body. During this free induction decay time period following excitation, the sample is subjected to a different magnetic field. This second applied magnetic field is given by:

$$H(x,y,t) = H_0 + xG_1(t) + yG_2(t). \tag{3}$$

As is seen above, this spatial differentiation magnetic field does not depend upon z. It is to be particularly noted, to avoid confusion, that the functions of time $G_1(t)$ and $G_2(t)$ in equation (3) are unrelated to the $G(t)$ seen in equation (2). Nonetheless the functions $G_1(t)$ and $G_2(t)$ play a significant role in reconstructing an image from the signals received. This is more particularly described below. For the proper understanding of the spatial differentiation properties associated with the magnetic field given by equation (3), it is most significant that this field depend upon the x and y coordinate locations within the slab. This dependence upon x and y permits the later determination of the nuclear spin distribution association with a particular pixel centered at the location (x,y) in the slab. Additionally, the dependence of the spatial differentiation magnetic field on the time parameter permits x and y coordinate data to be coded into a single time signal. Because of the presence of this spatial differentiation magnetic field, the radiated magnetic signal occurring during free induction decay, comprises components whose frequencies are dependent upon spatial location within the slab. Moreover, this dependence on spatial location is also dependent upon time because of the variation of the magnetic field during this stage with time as specified by equation (3) and in particular by functions $G_1(t)$ and $G_2(t)$ which comprise substantially audio frequency components. The functions $G_1(t)$ and $G_2(t)$ are said to define magnetic gradient fields because of the following relationship between the magnetic field as specified in equation (3) and the functions $G_1(t)$ and $G_2(t)$, in particular:

$$G_1(t) = \partial H/\partial x \tag{4}$$

$$G_2(t) = \partial H/\partial y \tag{5}$$

Additionally, two functions, $K_1(t)$ and $K_2(t)$, are defined which are determined by $G_1(t)$ and $G_2(t)$, respectively, as follows:

$$K_1(t) = \gamma \int^t G_1(t')dt' \tag{6}$$

$$K_2(t) = \gamma \int^t G_2(t')dt' \tag{7}$$

If t is considered as a time parameter, the numbers $K_1(t)$ and $K_2(t)$ describe a point in a two-dimensional space referred to herein as K-space. With the variation of the time parameter, t, the point in the K-space traces out a single trajectory or sequentially, a plurality of trajectories. An understanding of the implications of these K- space trajectories is desirable for a complete understanding of the present invention, particularly with respect to the reconstruction stage. $G_1(t)$ and $G_2(t)$ determine the K-space trajectories which are often periodic with period $T'$. The precession frequency $\omega$ and phase angle $\Phi$ are associated by the relation $$\omega = \frac{d\Phi}{dt}, \quad (8)$$

where $\Phi$ is a function of x, y, and t given by:

$$\Phi(x,y,t) = K_1(t)x + K_2(t)y + \omega t. \quad (9)$$

The last linear term in $\omega t$ corresponds to the free precession frequency $\omega$ at the average value of the field, $H_0$. Thus, a slab of nuclear spin within a thin slab of the sample body is selectively excited by the combination of a magnetic gradient field and a radio frequency energy source. Following the excitation, free induction decays occur during which absorbed radio frequency energy is reradiated at spatially differentiated frequencies. To receive such reradiated energy the sample body is surrounded by a receiver coil which has a voltage $V(t)$ induced therein having the following form:

$$V(t) = C_1 i \omega e^{i\omega t} \int\int \mu(x,y) \exp[i(K_1(t)x + K_2(t)y + \omega_1(x,y)t) - t/T_2(x,y)] dx dy \quad (10)$$

where $C_1$ is a constant of proportionality, $\mu(x,y)$ is the local nuclear spin population density, and $T_2(x,y)$ is the local spin-spin relaxation time (on the order of 0.05 sec), and i is the square root of $-1$. Equation (10) expressed the desired coding of spatial information about the object into a time-dependent signal. Such a process reduces the problem of signal encoding to devising field gradient histories, that is $K_1(t)$ and $K_2(t)$ signals, which are readily realizable in practice and which transform the spatial information of the object into a temporal dependence of a nuclear magnetic resonant signal. This is done in a way such that the encoded spatial information is readily decoded by linear reconstruction algorithms. It is also seen that the voltage $V(t)$ in equation (10) is regarded as a complex time function having respectively, in-phase and quadrature phase, base-band signals $I(t)$ and $Q(t)$ respectively:

$$V(t) = I(t) + iQ(t) \quad (11)$$

It is also to be noted that in equation (10) $T_2(x,y)$ is included because the spins at various points within the slab radiate only for an effective period of length $T_2$ and for medical applications this effect is very desirable since $T_2$ for protons tends to vary more widely than $\mu(x,y)$ for the internal organs.

Next considered is the third and last stage of nuclear magnetic resonance image generation produced in accordance with the present invention. The object of reconstruction is to determine $\mu(x,y)$ from $V(t)$. These quantities, according to equation (10), are related like Fourier transforms except for the factor $\exp[-t/T_2(x,y)]$. Equations (6), (7), (9), and (10) implicitly define K-space, a two-dimensional space whose coordinates are given by $K_1(t)$, $K_2(t)$. With non-zero field gradients, the spin system traces out a time dependent trajectory in K-space whose geometric properties largely determine the characteristics of the reconstructed picture. From equation (10), it is clear that the signal has the form of a Fourier transform of a local spin-spin density evaluated at a particular point of the trajectory in K-space. It is possible to enhance edge contrast in the image by employing a K-space trajectory dominated at points distant from the K-space origin. K-space trajectories near to the K-space origin emphasize gross or low frequency features of the image. The "velocity" of a point in K-space is proportional to the field gradients applied to the object and the acceleration of a point in K-space is proportional to the rate of change of these field gradients. It is also to be noted that K-space trajectories may be repeated several times by varying parameters which cause the trajectories to traverse K-space in a preferably uniform pattern.

In general, the reconstruction from $V(t)$ takes the following form:

$$\mu^R(x,y) = \int V(t)F(t)\exp[-i[K_1(t)x + K_2(t)y + \omega_1(x,y)t]]dt, \quad (12)$$

where $\mu^R(x,y)$ represents the reconstructed form of the local spin density at point $(x,y)$. In the above $f(t)$ is a suitably chosen weighting function (for example, a damped exponential) and $\omega_1(x,y)$ is determined by spatial inhomogeneities of the static field in accordance with the following:

$$\omega_1(x,y) = \gamma \Delta H(x,y), \quad (13)$$

where $\Delta H(x,y)$ represents slight variations in the $H_0$ magnetic field. Equation (12) above expresses a general method of reconstruction; however, various specific simplifications of this equation result with certain judicious choices for the K-space trajectories, that is for the various $K_1(t)$ and $K_2(t)$ functions. These are more particularly described below and certain of these K-space patterns may be seen in FIGS. 7, 8, and 9.

Having considered the three stages of image generation, attention is now turned to the apparatus of the present invention for carrying out the functions associated with each of the above-described stages, namely, excitation, spatial differentiation, and reconstruction.

Figure 1:
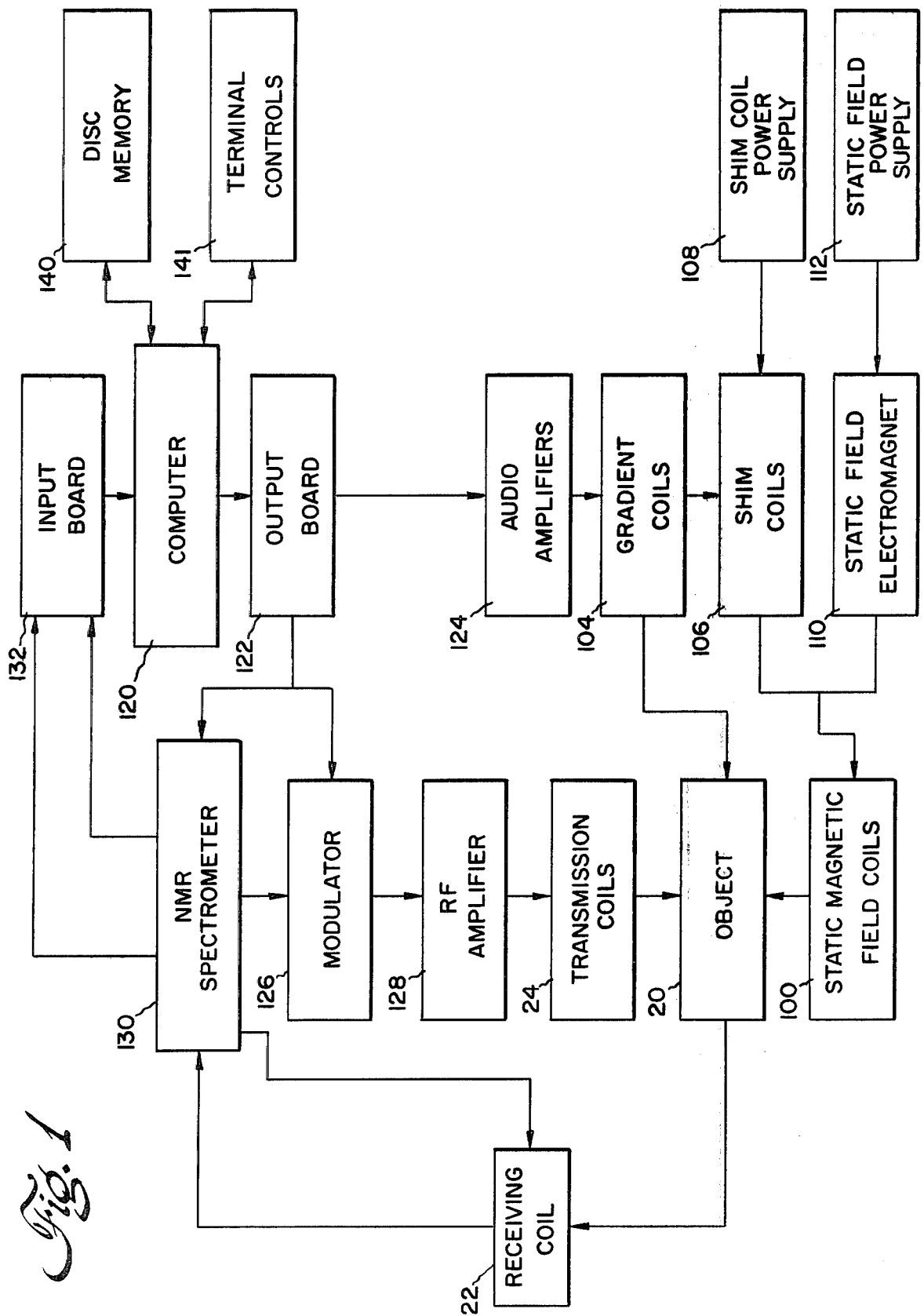
FIG. 1 is a schematic block diagram illustrating the organization of an imaging apparatus in accordance with the present invention.

FIG. 1 is a schematic diagram indicating the interrelationship between the various portions of the present nuclear magnetic resonant imaging apparatus. A description of this apparatus is best begun at the object 20 which is the specimen from which an image is generated. This object is subjected to static magnetic field by means of static magnetic field coils 100. These coils are operating during the entire data collection process (excitation and spatial differentiation stages) to generate a constant magnetic field $H_0$. However, because of geometric and physical constraints, the magnetic field $H_0$ may exhibit some slight dependency on x and y coordinate locations. Such slight variations may be compensated for by shim coils 106 powered from shim coils power supply 108. These shim coils provide any needed correction and operate in conjunction with the static field electromagnet 110 which is energized by static field power supply 112. Also coupled to object 20 are transmission coils 24 which are energized by radio frequency amplifier 128. These transmission coils 24 operate during the excitation stage of the imaging process to selectively excite the nuclear spins within a selected slab. Slab selection is controlled by a combination of the frequency with which coils 24 are energized and the variation of the magnetic field in the z direction. The radio frequency pulses applied to the transmission coils are shaped, as described below, by modulator 126. The shaping of the radio frequency pulses serves to more nearly isolate the slab whose image is desired. During the excitation stage, the z gradient magnetic field is provided by gradient coils 104. Gradient coils 104 are energized by audio amplifiers 124. While described as gradient "coils", these coils may, in fact, simply be current carrying conductors disposed appropriately in the vicinity of the specimen 10. They are, nonetheless, coils in the sense that there is a return path or loop which is typically not in the vicinity of the object and which is generally configured to minimize the presence of any stray magnetic fields. These structures are more particularly described in FIGS. 2–4, discussed below. The object 20 is also coupled to receiving coil 22 which acts to receive reradiated electromagnetic radio frequency energy during the spatial differentiation stage of image. The signal from this coil V(t) is input to nuclear magnetic resonance spectrometer 130. The spectrometer 130 provides both I(t) and Q(t) signals to the input board 132. This input board acts as an analog-to-digital interface between the spectrometer 130 and digital computer 120. Computer 120 receives the digitized output signal V(t) and stores it on disk memory 140 for later analysis and reconstruction. The computer 120 interfaces with apparatus operators through terminal controls 141. Computer 120 drives the imaging system through output board 122. The output board primarily controls the radio frequency modulator 126 and the audio amplifiers 124. It is the function of the output board to provide timing and trigger information and also to provide such signals as G(t), $G_1(t)$, and $G_2(t)$. Following data collection in the excitation and spatial differentiation stages, signals representative of the local spin population distributions are generated by computer 120 from data stored in the disk memory 140. This is typically done in a non-real-time mode.

Figure 2:
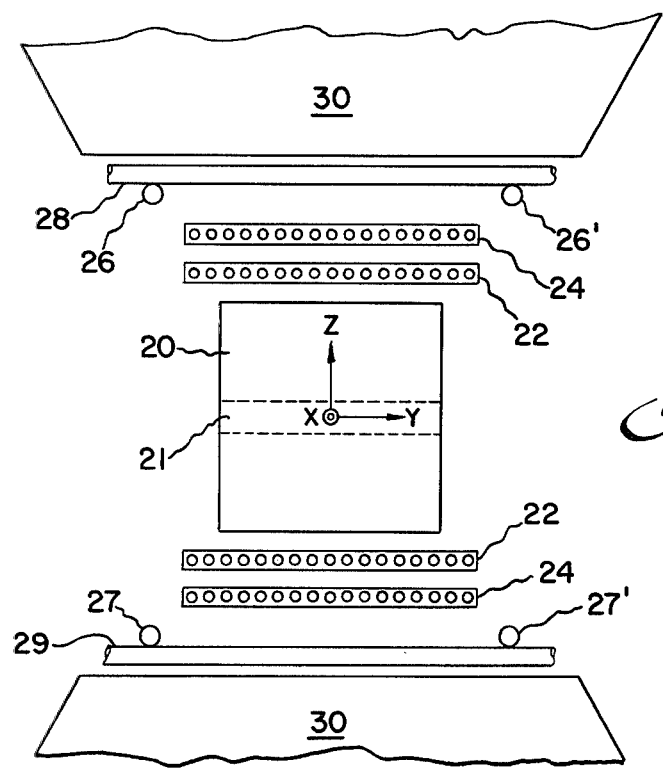
FIG. 2 is a partial cross-sectional side elevation view (looking into the y-z plane) illustrating the relationships between the magnetic field and radio frequency coils to the body under investigation.

FIG. 2 is important for an understanding of the relationships between the physical parts of the present apparatus. In FIG. 2 is shown specimen body 20 where thin slab 21 is shown in phantom view. Planar slab 21 has oriented therein x and y coordinate directions. A normal to the slab defines the z coordinate direction so that the x, y, and z axis form the mutually orthogonal directions of a Cartesian coordinate system. Surrounding the body 20 is receiving coil 22. Surrounding receiving coil 22 is transmission coil 24. An alternate configuration of these coils is shown in FIG. 5. The static magnetic field $H_0$ is provided by electromagnets 30. While these magnets are depicted as having pole faces, they may comprise air core magnetic coil structures, if desired. The primary requirement for magnetic structure 30 is that it provide a spatially uniform static magnetic field throughout the specimen 20. Also shown are gradient coils 26, 26', 27, 37', 28, and 29. Coils 26, 26', 27, and 27' provide magnetic field gradient control in the y direction. These last listed coils carry the signal $G_2(t)$. Likewise, coils 28 and 29 (along with 28' and 29' visible in FIG. 3) are employed to determine the magnetic gradient field in the x direction. That is to say, these lastly described coils carry the $G_1(t)$ signal. An appreciation of this is found in equation (3) which describes the spatial and temporal variations of the magnetic field during the spatial differentiation stage of image generation. Similarly, coils 26, 26', 28, and 28' act in unison during the excitation stage in opposition to coils 27, 27', 29, and 29' to produce the time-varying magnetic field varying linearly with the z direction as given in equation (2). Alternatively, the z field gradient could be provided by separate circular loops arranged as a Maxwell coil pair and connected in opposition. Not shown in FIGS. 2–4 for the gradient coils are current return paths which are selected to minimize stray magnetic fields and interference between the coils. This is readily achieved by providing relatively long and straight conductors in the vicinity of the object to be studied.

Figure 3:
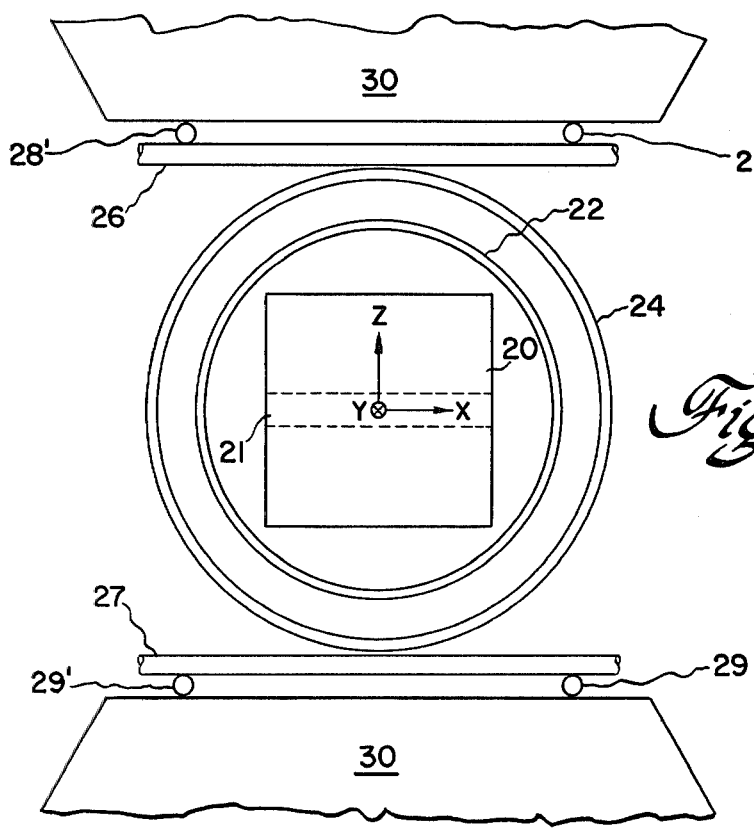
FIG. 3 is a front elevation view of the apparatus of FIG. 2, that is, looking into the x-z plane.

FIG. 3 is a view of the apparatus shown in FIG. 2 viewed from a direction orthogonal to the x-z plane. Here shown are receiving coil 22 and transmission coil 24 surrounding the specimen 20 with the desired slab 21 therein lying in the x-y plane. Because of the relative strength of the transmitted and received electromagnetic radiation, it is preferred that the receiving coil 22 be located more proximal to the excited slab. An alternate orientation of the receiving coil is shown in FIG. 5. Also shown in FIG. 3 are electromagnetic structures 30 for providing a static and uniform and magnetic field $H_0$. Seen too are coils 29' and 28' for controlling x-direction gradiations. Coils 28' and 29' are not visible in FIG. 2 because of the viewing direction, but their function is nonetheless accurately discussed above. It is readily seen that the conductors 26, 26', 27, 27', 28, 28', 29, and 29' are operable to produce the magnetic fields described in equations (2) and (3).

Figure 4:
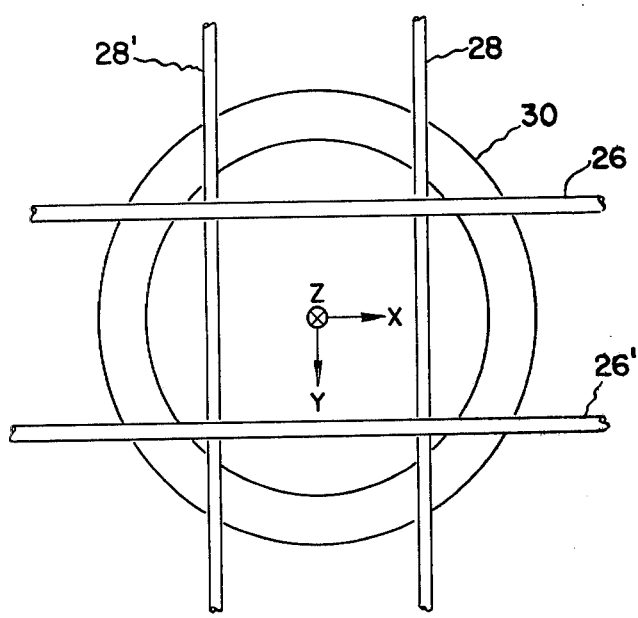
FIG. 4 is a detail drawing of a portion of FIGS. 2 and 3 illustrating the placement of the gradient coils.
Figure 5:
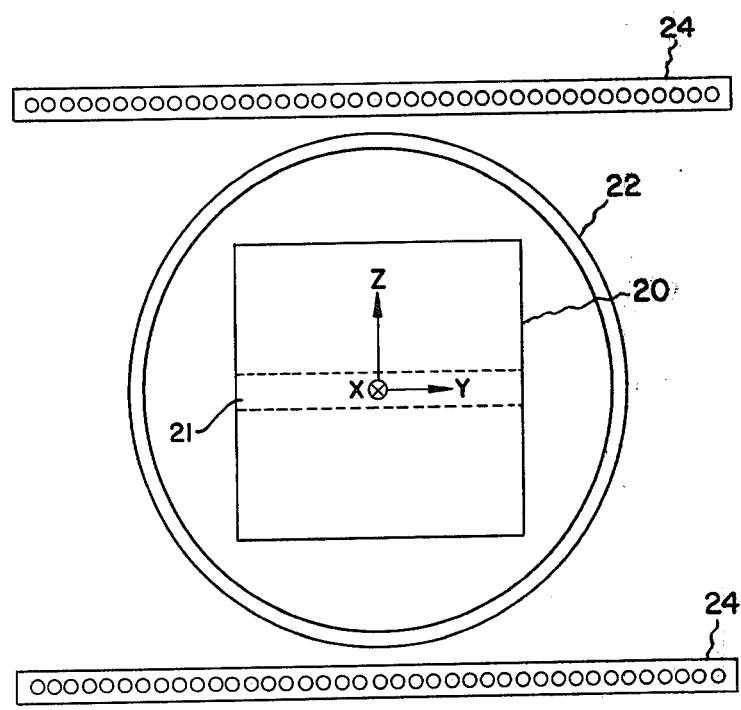
FIG. 5 is a partial cross-sectional view illustrating an alternate arrangement between the transmitting radio frequency coil and the receiving radio frequency coil.

FIG. 4 illustrates a portion of the apparatus shown in FIGS. 2 and 3. In particular, it illustrates the relationship of the gradient coils to electromagnetic structure 30 in the vicinity of the specimen. Gradient coils 26, 26', 28, and 28' are shown. It is, of course, understood that these conductors are insulated from one another. These current carrying conductors, along with their counterparts 27, 27', 29, and 29', produce the desired magnetic fields within the specimen 20 when driven by appropriate current signals from audio amplifier 124.

FIG. 5 illustrates an alternate arrangement of the transmission and receiving coils 24 and 22, respectively. In particular, FIG. 5 describes a portion of the same view seen in FIG. 2. However, in FIG. 5, receiving coil 22 is now oriented orthogonally to the axis of the transmission coil 24, whereas in FIG. 2 the axis of these respective coils are substantially coincident. The configuration shown in FIG. 5 is preferred because this configuration produces minimal interference with the radio frequency pulses during the excitation stage.

Next are considered the specific details for proper selective excitation. To achieve the maximal resolution and two-dimensional imaging for a limited bandwidth and fixed scan time, it is necessary to limit the region of excitation to a relatively thin slab. This can be accomplished by providing a spatially dependent ratio frequency field which saturates the spins outside a selected plane, or by low frequency (audio) magnetic field gradients which establish spatially dependent precession frequencies for selective excitation. The latter approach is preferably employed in the present invention. Regardless of the method used to achieve this selective excitation, a truly two-dimensional imaging method prevents the dephasing of adjacent spins on opposite surfaces of the two-dimensional excited region. This implies that the gradient must be greatly reduced during the free induction decay. To insure that nuclear spins at a greater offset z distance than a few $\Delta z$ are not greatly excited by the radio frequency field, it is required that:

$$(G)(\Delta z) \approx H_1, \tag{14}$$

where G is the maximum absolute value of G(t) and $H_1$ is the peak amplitude of the radio frequency pulse.

If the imaging period is longer than $T_2$, repeated excitation is required. Repeated excitation is easily achieved in practice by a periodic pulse sequence whose period is shorter than $T_2$ and which is applied when the spins to be excited are in phase. This last requirement is satisfied by assuring that there is no net current in the gradient coils between radio frequency pulses. To minimize field gradients when implementing a periodic pulse sequence, it is necessary to take the longest pulse interval compatible with signal intensity losses. By way of example, for an image arranged in an array of 100×100 pixels, the shortest acceptable trajectory length for paths that return to the origin of K-space passes through approximately 500 pixels. For a pulse repetition rate of 30 Hz, this implies that the entire trajectory takes approximately 0.6 sec or that gradients of at least 4 gauss are required. One method of exciting the object is to reduce the x-y gradients to approximately 0.2 gauss, increase the z-gradient to approximately 1 gauss/cm and apply an RF pulse. However, this method of selective excitation selects out a different surface for excitation than an isochromat of the static field. This is due to nonuniformities in either the static field, the z-gradient field, or both. In accordance with a preferred embodiment of the present invention, this selective excitation problem is avoided by applying a time-dependent z-field gradient with no DC component together with a modulated radio frequency pulse whose amplitude is proportional to the gradient multiplied by an appropriate window function.

There are two criteria to be satisfied by spatially adequate selective excitation. The first of these is that the excitation be well confined to a definite physical region, that is the "tails" of the excited region are negligible. Second, the signal from all spins should add coherently, that is, the transverse magnetization points everywhere in the same direction. To satisfy these requirements, it is necessary to apply an audio field gradient orthogonal to the desired plane of excitation and to use long radio frequency pulses with controlled, carefully shaped envelopes determined by the time dependence of the audio field gradient G(t). The function K(t) is defined as follows:

$$K(t) = \gamma \int^{t} G(t')dt' . \qquad (15)$$

If this is the case, then the relative phase $\phi'$ of spin located $\Delta z$ above the center of the desired slab is:

$$\phi' = -K(t)\Delta z \qquad (16)$$

To achieve a well localized excitation, it is necessary that the radio frequency pulse envelope (which vanishes outside the interval $[-K_0, K_0]$) have concentrated spectral content. From the above, it can be shown that these considerations lead to a choice for the radio frequency pulse envelope $h_1(t)$ which is as follows:

$$h_1(t) = h_1 \gamma G(t) f(K/K_0)(T_0/K_0), \qquad (17)$$

wherein $h_1$ is a constant and $T_0$ is a point in time when G(t) is close to zero, and f is a properly chosen window function. A particularly suitable example of this excitation method is provided by a set of G(t), K(t), and f($\omega$) given below:

$$G(t) = G_0[(T_0^2 - t^2)/T_0^2]\exp[-(t/T_0)^2/2] \qquad (18)$$

$$K(t) = \gamma G_0 t \exp[-(t/T_0)^2/2] \qquad (19)$$

$$f(\omega) = \begin{cases} 1 & |\omega| \leq 0.8 \\ 0.5(1 + \cos 5\pi\omega) & 0.8 < |\omega| < 1 \\ 0 & |\omega| > 1 \end{cases} \qquad (20)$$

The functions shown in equation (18) and (19) are shown in FIGS. 6a and 6b, respectively. The function f($\omega$) is simply a cosine roll-off window function (not shown). However, the resulting radio frequency pulse envelope $h_1(t)$ is shown in FIG. 6c. In these figures, $T_0 = 1$ msec. The average radio frequency field during the pulse is approximately 3.7 milligauss. The peak radio frequency field is somewhat larger, being approximately 6.5 milligauss. Fields of approximately this strength lead to the largest average nuclear magnetic resonance signal for the given relaxation times and a 30 Hz excitation rate. These excitation functions fulfill the above-mentioned criteria of having a well-localized region of excitation over which the excited spins all point in the same direction. This excitation is novel and a substantial improvement over prior known excitation sequences.

Figure 7:
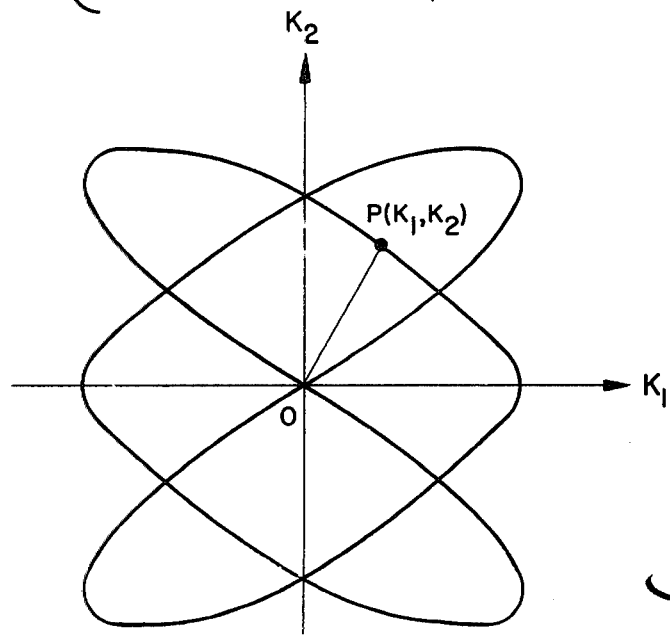
FIGS. 7–9 illustrate several possible K-space trajectories. (The concept of K-space is described below).

Next is considered specific details associated with the reconstruction stage and the spatial differentiation stage of image generation. Several examples of K-space trajectories are now considered. These include the Lissajous trajectories, the "bull's eye" trajectories, and the rosette trajectories. An example of a Lissajous trajectory is seen in FIG. 7. For a Lissajous trajectory, it is seen that $K_1(t)$ and $K_2(t)$ are given by:

$$K_1(t) = K \sin a_1 t \qquad (21)$$

$$K_2(t) = K \cos a_2 t \qquad (22)$$

where $a_1 = 2\pi n_1/T'$ and $a_2 = 2\pi n_2/T'$, $n_1$ and $n_2$ being relatively prime odd integers. The signal from such a K-space trajectory is obviously periodic: $\phi'$ is therefore decomposible into a line spectrum except for the exponential decay in amplitude due to relaxation which causes the spectral lines to broaden. The primary advantage of the Lissajous K-space trajectory is the ease with which it is generated, that is, through sinusoidally varying gradient fields. Additionally, the Lissajous trajectory for K-space satisfies some of the above-described criteria that such trajectory should possess.

Figure 8:
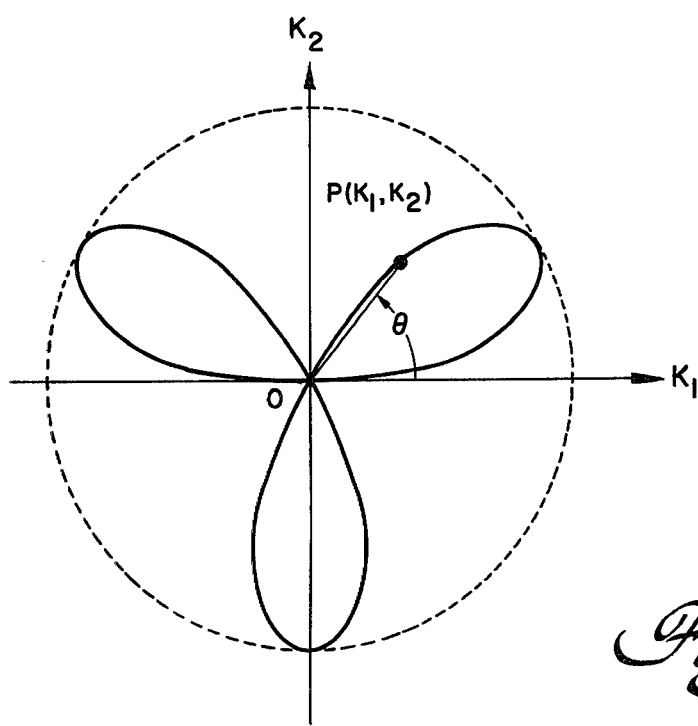

Another suitable trajectory for K-space is the rosette pattern illustrated in FIG. 8. For the rosette K-space trajectory, suitable choices for $K_1(t)$ and $K_2(t)$ are the following:

$$K_1(t) = K \sin(a_1 t) \cos(a_2 t) \qquad (23)$$

$$K_2(t) = K \sin(a_1 t) \sin(a_2 t) \qquad (24)$$

where K, $a_1$ and $a_2$ are constants. A suitable value for $a_1$ is $2\pi(90)$ Hz and for $a_2$ is $2\pi(30)$ Hz, assuming an imaging period of 33 milliseconds has been chosen. Such values cause the rosette to be traced out at a rate of 30 trajectories per second. The constant K is approximately equal to 10 per centimeter and determines the maximum spatial resolution attainable by the relationship:

$$K\Delta x \approx \pi. \qquad (25)$$

For these conditions, $\Delta x$ is approximately equal to 0.3 cm. The rosette pattern shown in FIG. 8 is rotated by 6° after each reexcitation pulse. This results in complete coverage of a disk in K-space after 20 repetitions of excitation for a period $\tau$ followed by relaxation for a period T. In the above example, these 20 repetitions are accomplished in approximately 0.76 secs. This sequence generates data necessary for imaging objects of approximately 30 cm$^2$ with a resolution of approximately 0.3 cm. In general, the maximum size of the object that can be imaged by such a method is determined by:

$$X(\Delta K) \approx \pi \tag{26}$$

where $\Delta K$ is the typical spacing between adjacent portions of the trajectory in K-space and X is the diameter of the sample. The rosette trajectory is particularly well suited in its simplicity; the x and y gradient fields are produced with the sum of two sinusoidally varying currents each. Additionally, matched filter reconstruction algorithms for this trajectory lead to closed-form analytical expressions for the point response functions.

An additional K-space trajectory is the spiral of Archimedes, $r=a\theta$, expressed parametrically as:

$$r = \frac{(r_o^2 + 4Ct)^{\frac{1}{2}} - r_o}{2} \tag{27}$$

$$\theta = \frac{(r_o^2 + 4Ct)^{\frac{1}{2}} - r_o}{2a} \tag{28}$$

Typical values for the constants in the above equations for the spiral of Archimedes include a value of $6.7 \times 10^3$ cm$^{-2}$ sec$^{-1}$ for C, a value of 0.5/cm for a, and a value of 1/cm for $r_0$, where r and $\theta$ are polar coordinates in K-space. This trajectory is followed for approximately 3 turns about the origin until the trajectory winds back to the origin on the curve $r=-a\theta$. One reason for choosing the spiral trajectory is that a family of rotated spirals easily fills the two-dimensional disk extremely uniformly at any fixed value of $\theta$, the r values for adjacent curves being in a linear progression between r=0 and r=r$_0$. The time parametrization of these Archimedian spirals was chosen in such a way that, in the limit of a large number of curves the amount of time spent in any small element of area by the family of spirals tends to be constant for sufficiently large values or r. It is clear that these conditions are satisfied by the Archimedian spirals with the given parametrization. These spirals express the property of having a uniform density of trajectory lines in K-space and spend a uniform amount of time in each K-space region. These spirals essentially give a constant signal-to-noise ratio distribution over all different spatial frequencies of the object. If it is necessary to emphasize higher spatial frequencies, the curves are modifiable so as to traverse the uniform space and the lines but to increase their density to achieve greater signal-to-noise ratios at higher spatial frequencies.

Figure 9:
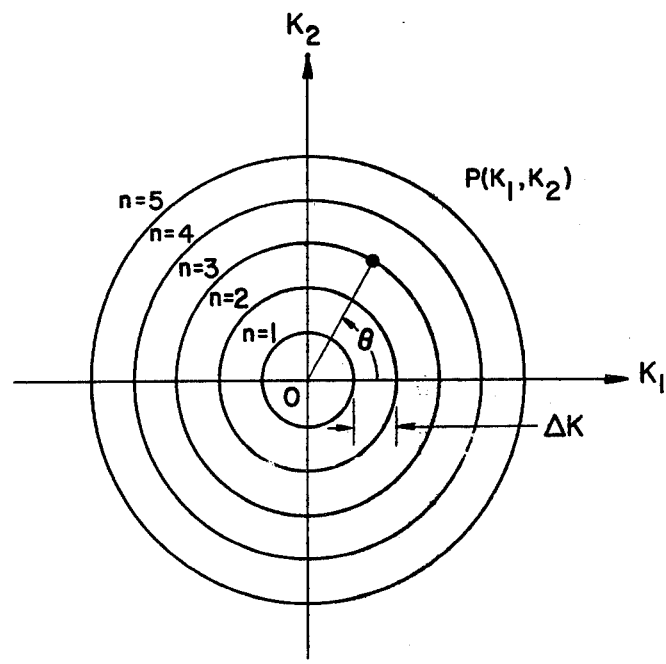

Next is considered a set of K-space trajectories referred to herein as the "bull's eye" pattern, the term being obvious from the pattern depicted in FIG. 9. A preferred form of the reconstruction algorithm is given for this pattern. In particular, consider the series of N+1 circles in K-space given by:

$$K_1{}^n(t) = n\Delta K \sin \omega_n t \tag{29}$$

$$K_2{}^n(t) = n\Delta K \cos \omega_n t \tag{30}$$

for n=0, 1, ..., N. The form of these trajectories is shown in FIG. 9 for n=1, 2, 3, 4, 5. For n=0, the trajectory is obviously the single point at the origin in the K-space. If the nuclear spins are prepared in the initial state where $K_1{}^n$ (0)=0 and $K_2{}^n$ (0)=$n\Delta K$, then the K-space trajectories given immediately above are generated by the following field gradients:

$$G_1{}^n(t) = (n\omega_n \Delta K/\gamma) \cos \omega_n t \tag{31}$$

$$G_2{}^n(t) = (-n\omega_n \Delta K/\gamma) \sin \omega_n t \tag{32}$$

if the spins begin at $K_1 = K_2 = 0$, for example, the initial preparation cited above is achieved by applying a y gradient of magnitude $G_0$ for a time $n(\Delta K/\gamma G_0)$. It is also noted here that if $\omega_n$ is chosen to be inversely proportional to n, then the amplitude of the field gradients as given in equations (31) and (32), is independent of n. This guarantees a constant signal bandwidth. Under these conditions, the phase of the spin at point (x, y) is given by:

$$\begin{aligned}\Phi(x,y) &= K_1(t)x + K_2(t)y \\ &= n\Delta K(x \sin \omega_n t + y \cos \omega_n t) \\ &= nr(\Delta K)\sin(\omega_n t + \theta),\end{aligned} \tag{33}$$

in which the first of the above cited equations has been transformed to polar coordinates wherein $x=r \cos \theta$ and $y=r \sin \theta$. The signal voltage observed for the n$^{th}$ circle is:

$$V^n(t) = C \int_0^{2\pi} \int_0^\infty \mu(r,\theta) \exp[inr \Delta K \sin(\omega_n t + \theta)] r dr \, d\theta, \tag{34}$$

wherein the superscript n is a true superscript and not an exponent. By taking note of the following identify involving Bessel function expansion:

$$\exp[iz \sin v] = \sum_{m=-\infty}^\infty J_m(z) \exp[imv], \tag{35}$$

where $J_m(z)$ is the n$^{th}$ order Bessel function, the voltage for the n$^{th}$ circle in equation (34) may be written as:

$$V^n(t) = \sum_{m=-\infty}^\infty V^{nm} \exp[im\omega_n t], \tag{36}$$

where $$V^{nm} = C \int_0^\infty \mu_m(r) J_m(nr \Delta K) r dr \tag{37}$$

where $$\mu_m(r) = \int_0^{2\pi} \mu(r,\theta) \exp[im\theta] d\theta. \tag{38}$$

The form of these equations suggests that the image of the object be reconstructed in a two-step process in which $\mu_m(r)$ is found from equation (37) and then to reconstruct $\mu_m(r,\theta)$ from equation (38). Proceeding in this direction, the function $V^m(K)$ for $K=n\Delta K$ is given by:

$$V^m(n\Delta K) = V^{nm} \qquad (39)$$

This may be substituted into equation (37) to yield:

$$V^m(K) = C \int_0^\infty \mu_m(r) J_m(Kr) \, r dr, \qquad (40)$$

in which K is treated as a continuous variable. The solution of equation (40) is then immediately provided by the Hankel transform inversion formula (see "Tables of Integral Transforms", Vol. 2, page 5 by Erdelyi et al.):

$$\mu_m(r) = (1/C) \int_0^\infty V^m(K) J_m(Kr) \, K dK. \qquad (41)$$

Equation 41 may written as an approximate integral having the following form:

$$\mu_m(r) = ((\Delta K)^2/C) \sum_{n=0}^N n V^{nm} J_m(nr\,\Delta K) \qquad (42)$$

In view of equations (38) and (42), $\mu(r,\theta)$ is solved for as follows:

$$\mu(r,\theta) = \sum_n \mu_m(r) \exp[-im\theta] \qquad (43)$$
$$= ((\Delta K)^2/C) \sum_{n=0}^N \sum_{n=-M(n)}^{M(n)} n V^{nm} J_m(nr\,\Delta K) \exp[-im\theta].$$

The limits on the summation over n in equation (43) are determined by bandwidth of the system as expressed in equation (36). The condition that the effective sampling rate in K-space be equal for the radial and angular directions leads to the condition that M(n) is approximately equal to $\pi(n)$, which implies that the number of side bands required is proportional to the radius of the circle in K-space. The required bandwidth B is given by:

$$B = 2Mf_n \approx 2\pi n f_n = n\omega_n. \qquad (44)$$

It is also noted that in equation (36) the $V^{nm}$ may be obtained from convential Fast Fourier Transform methods. Knowing these then, the nuclear spin density $\mu(r,\theta)$ is expressed in polar coordinates in equation (43). Accordingly, it is seen how the spatial differentiation magnetic field gradients as specified in equations (31) and (32) result in an easily constructible image indicative of the nuclear spin densities.

It is also noted that less esoteric algorithms may be applied to effect an image reconstruction. In particular, it is noted that a matched filter could be provided (algorithmically) for each pixel. Digital filter methods for such operations are well known, but because of the large number of pixels, an algorithmic approach such as this requires a large amount of time to generate an image.

From the above, it may be appreciated that the apparatus of the present invention may be operated in a rapid manner to produce images representative of nuclear magnetic resonant spin densities quickly and accurately. The spatial spin density information is encoded into a time-dependent signal. The field gradients employed in the present invention are readily realizable and permit transformation of the spatial information of the object into a temporal dependence which is readily reconstrucible. Straightforward linear reconstruction algorithms are employed. Additionally, the field uniformity requirements of the present invention are significantly better than other methods of nuclear magnetic resonant imaging. Also, the apparatus of the present invention operates to selectively excite a well-defined slab of the specimen. The imaging method of the present invention leads to a greater contrast among the internal organs than is presently available in other nuclear magnetic resonance imaging devices.

While this invention has been described with reference to particular embodiments and examples, other modifications and variations will occur to those skilled in the art in view of the above teachings. Accordingly, it should be understood that within the scope of the appended claims, the invention may be practiced otherwise than is specifically described.

The invention claimed is:

1. A nuclear magnetic resonance apparatus for determining spin density distribution in a thin planar slab of an object under examination containing nuclear spins, said body being oriented with respect to orthogonal x and y coordinate directions defined therein and also to a z coordinate direction orthogonal to said slab and to said x and y coordinates within said slab, said apparatus comprising:

excitation means for selectively exciting said nuclear spins in said slab, said excitation means including means for applying to said object for a predetermined time period an excitation magnetic field having a gradient in the z-axis direction, said gradient being defined by a function G(t) not having a DC component, said excitation means also including means for applying a pulse of RF energy to said object during the time that said excitation magnetic field is applied, said pulse having an envelope defined by a function $h_1(t) = h_1 \gamma G(t) f(K/K_0)(T_0/K_0)$ wherein $h_1$ is a constant, $T_0$ is a point in time when G(t) is approximately zero, and f is a window function, so that said excited nuclear spins undergo a radiative free induction decay following termination of said excitation and so that nuclear spins in other regions of said object are substantially unexcited;

means for applying to said object a spatial differentiation magnetic field H(x,y,t), during at least a portion of the free induction decay of said excited nuclear spins, said magnetic field having the form $H_0 + G_1(t)x + G_2(t)y$;

means for receiving radiated electromagnetic energy produced by said free induction decay and converting said energy to a time-varying electric signal representative of the magnitude of said energy; and means for operating on said electrical signal to generate therefrom signals representative of the spin density distribution in said slab.

2. The nuclear magnetic resonance apparatus of claim 1 in which $G(t) = G_0((T_0^2 - t^2)/T_0^2) \exp[-(t/T_0)^2/2]$.

3. The nuclear magnetic resonance apparatus of claim 1 in which said receiving means comprises a coil disposed about said object.

4. The nuclear magnetic resonance apparatus of claim 1 in which said radio frequency pulse means includes a transmission coil disposed about the object.

5. The nuclear magnetic resonance apparatus of claim 4 in which said radio frequency pulse transmission coil is the same as the means for receiving radiated electromagnetic energy.

6. The nuclear magnetic resonance apparatus of claim 4 in which said radio frequency pulse transmission coil is disposed within and axially perpendicular to a coil operating as the means for receiving the radiated electromagnetic energy.

7. The nuclear magnetic resonance apparatus of claim 1 in which said functions $G_1(t)$ and $G_2(t)$ are selected to produce K-space trajectories which are Lissajous figures.

8. The nuclear magnetic resonance apparatus of claim 1 in which said functions $G_1(t)$ and $G_2(t)$ are selected to produce K-space trajectories which are rosettes.

9. The nuclear magnetic resonance apparatus of claim 1 in which said functions $G_1(t)$ and $G_2(t)$ are selected to produce K-space trajectories which are Archimedian spirals.

10. The nuclear magnetic resonance apparatus of claim 1 in which said functions $G_1(t)$ and $G_2(t)$ are selected to produce K-space trajectories which are concentric circles.

11. The nuclear magnetic resonance apparatus of claim 1 in which said spatial differentiation magnetic field $H(x,y,t)$ defines a plurality of K-space trajectories, wherein said trajectories provide a complete and uniform coverage of K-space and wherein the dwell time in each region of K-space is approximately equal so that a detailed image of the entire portion of said object lying in the K-space plane is produced.

12. The nuclear magnetic resonance apparatus of claim 1 in which said spatial differentiation magnetic field $H(x,y,t)$ defines a plurality of K-space trajectories, wherein said K-space trajectories concentrate on and have greater dwell time in selected region of K-space, thus enhancing the image contrast in said selected regions.

13. The nuclear magnetic resonance apparatus of claim 1 wherein the relation of the maximum absolute value G of said function G(t) to the peak amplitude $H_1$ of said function $h_1(t)$ is given by the expression $(G)(\Delta Z) \approx H_1$.

* * * * *

UNITED STATES PATENT AND TRADEMARK OFFICE
CERTIFICATE OF CORRECTION

PATENT NO. : 4,307,343
DATED : Dec. 22, 1981
INVENTOR(S) : Richard S. Likes

It is certified that error appears in the above—identified patent and that said Letters Patent is hereby corrected as shown below:

Column 6, line 16, equation (12) should read:

$$\mu^R(x,y) = \int V(t)f(t)\exp|-i[K_1(t)x + K_2(t)y + \omega_1(x,y)t]|dt$$

Column 7, line 53, change "37'" to -- 27 --

Column 10, line 6, equation (20) should read:

$$f(\omega) = \begin{cases} 1 & |\omega| \leqq 0.8 \\ 0.5(1 + \cos 5\pi\omega) & 0.8 < |\omega| < 1 \\ 0 & |\omega| > 1 \end{cases}$$

Column 12, line 56, equation (37) should read:

$$V^{nm} = C \int_0^\infty \mu_m(r) J_m(nr\ \Delta K) r\, dr$$

Signed and Sealed this

Twenty-seventh Day of April 1982

[SEAL]

Attest:

GERALD J. MOSSINGHOFF

Attesting Officer

Commissioner of Patents and Trademarks